United States Patent [19]

Mooney

[11] Patent Number: 4,990,416

[45] Date of Patent: Feb. 5, 1991

[54] DEPOSITION OF CATHODOLUMINESCENT MATERIALS BY REVERSAL TONING

[75] Inventor: John B. Mooney, San Jose, Calif.

[73] Assignee: Coloray Display Corporation, Fremont, Calif.

[21] Appl. No.: 368,268

[22] Filed: Jun. 19, 1989

[51] Int. Cl.$^5$ .............................................. G03F 7/28
[52] U.S. Cl. ...................................... 430/26; 430/198; 430/291; 430/394; 430/937
[58] Field of Search ............... 430/26, 29, 291, 330, 430/937, 198, 394, 49

[56] References Cited

U.S. PATENT DOCUMENTS

| | | | |
|---|---|---|---|
| 2,682,478 | 6/1954 | Howse | 430/23 |
| 2,959,483 | 11/1960 | Kaplan | 430/27 |
| 3,475,169 | 10/1969 | Lange | 430/421 |
| 3,481,733 | 12/1969 | Evans | 430/198 |
| 3,856,518 | 12/1974 | Strik et al. | 430/198 |

OTHER PUBLICATIONS

"Field-Emitter Arrays Applied to Vacuum Fluorescent Display", by Spindt, et al., IEEE Transactions on Electron Devices, vol. 36, No. 1, Jan. 1989.

Primary Examiner—Jose G. Dees
Attorney, Agent, or Firm—Flehr, Hohbach, Test, Albritton & Herbert

[57] ABSTRACT

A method for the deposition of phosphor containing materials to CRT or VFD faceplates using reversal toning is dislosed. The method incudes the steps of charging the phosphor containing particles and the surface of a patterned photoresist with a charge of the same sign so that the particles are accurately deposited directly to an uncharged transparent surface electrode on the substrate.

In a preferred embodiment, glass and/or polymeric binders may be included with the phosphor containing materials to enhance adherence to the substrate.

13 Claims, 1 Drawing Sheet

DEPOSITION OF CATHODOLUMINESCENT MATERIALS BY REVERSAL TONING

FIELD OF THE INVENTION

This invention relates to a method for depositing and adhering cathodoluminescent materials on a substrate, such as a transparent faceplate used in vacuum fluorescent displays (VFDs), using reversal toning.

BACKGROUND OF THE INVENTION

The deposition of cathodoluminescent materials onto cathode ray tube (CRT) substrates requires a method which accurately positions the particles and which causes the particles to firmly adhere to the substrate. This is especially critical for the deposition of phosphors onto substrates such as faceplates used in vacuum fluorescent displays (VFDs). The technology now being developed for such flat plate VFDs includes the use of field emitter arrays positioned at very short distances (for example 75 microns) from the cathodoluminescent phosphors as discussed in the article Field Emitter Arrays Applied to Vacuum Fluorescent Displays found at IEEE Transactions on Electron Devices, Vol. 36, No. 1, January 1989. As mentioned there, cathodoluminescence is useful in such applications because much is known about phosphors which are used in CRTs.

Many different methods are known for depositing phosphors on CRT faceplates. For example, in U.S. Pat. No. 3,475,169, phosphors are deposited by development of an exposed photoconductive layer wherein a liquid developer, which includes a polymeric binder, is used. This document discloses both the use of direct and reversal imaging onto a charged photoconductive layer, and mentions the problems of adapting electrostatic printing processes for use in the manufacture of CRTs. While the use of binders is helpful, such binders must be able to survive relatively high temperature bake out steps (about 400° C.) without degradation or discoloration. It has been found that few binders can withstand such temperatures.

U.S. Pat. No. 2,682,478 discloses a method of depositing powdered phosphors on a non-planar television screen (e.g. one having projecting multi-faceted shapes) which includes deposition of charged phosphor particles to an oppositely charged substrate surface. Glass binders may be included in the phosphor powder. Thus, while improved adherence would be expected, this method provides little guidance as to how to accurately define the appropriate deposition areas for a planar substrate.

U.S. Pat. No. 2,959,483 discloses the use of a photosensitive resist layer which is exposed, developed and treated with phosphor and filter materials. Once the phosphor and filter materials have been applied to the surface of the patterned photoresist, the faceplate is heated to remove the resist and fuse these materials to the faceplate. Where phosphors are applied on the surface of the photoresist, however, adherence of the phosphors after the fusing step is found to be unsatisfactory.

Phosphor containing cathodoluminescent materials have also been deposited by applying thin films to a substrate using vacuum evaporation. The difficulty with this approach is that the material to be deposited must be heat treated to about 900° C. to activate it to maximum efficiency. This temperature is not compatible with glasses which are commonly used as a substrate, such glasses having softening points of less than 900° C.

OBJECTS OF THE INVENTION

It is therefore an object of the invention to provide a method by which a phosphor containing cathodoluminescent material can be accurately deposited and firmly adhered to a transparent substrate without compromising either the substrate or the material being deposited.

SUMMARY OF THE INVENTION

The present invention is a method of depositing particles from a liquid toner to a transparent substrate, the particles including the desired phosphors, using reversal toning. Importantly, the pattern onto which the particles are deposited includes a layer of photoresist, which layer is developed prior to deposition such that the particles are deposited directly onto a thin conductive layer, and not on the surface of the resist. Additionally, the particles are more firmly positioned in the pattern by charging the particles with a charge of the same sign as the surface of the patterned photoresist.

In the preferred embodiment the method comprises the steps of coating a transparent substrate with a transparent electrode layer, applying a photoresist layer over that electrode, exposing and developing the photoresist to produce a pattern with openings to the electrode layer, corona charging the remaining photoresist surface with a charge of a first sign, depositing toner particles in the openings, the particles comprising a desired phosphor, and being charged with a charge of sign the same as that on the photoresist, and heating the substrate to remove the photoresist.

In the preferred embodiment of the invention, the process is repeated to deposit second and third phosphor containing materials to obtain a three color phosphor pattern. Further, a low melting glass and/or a polymeric binder may be used.

In the embodiment in which a polymeric binder is included in the toner, the binder temporarily binds the deposited phosphor particles such that the resist can be chemically removed and only one final heating step is used when three different desired phosphors have been deposited.

BRIEF DESCRIPTION OF THE DRAWINGS

The invention will be further understood by reference to the attached drawings, of which.

DETAILED DESCRIPTION OF THE PREFERRED EMBODIMENT

Figure 1:
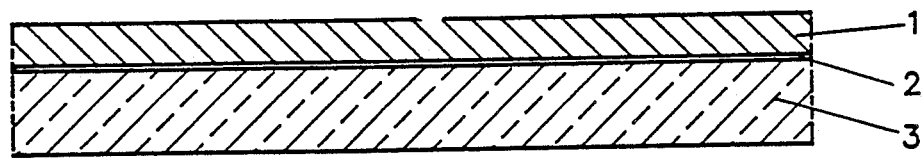
FIG. 1 shows the positions of the substrate, electrode and photoresist layers.

The layered structure of FIG. 1 shows transparent substrate 3 and transparent electrode layer 2. It is important that substrate 3 be a material which is transparent to allow viewing, that the substrate be chemically inert with respect to the materials used in the process and that it be dimensionally stable at all temperatures used. The substrate is generally planar for VFD applications, although the method of the invention is applicable to curved substrates, such as CRT face plates as well. Materials such as common "soft glass" (i.e. glasses having a softening point of 500°–600° C.), borosilicate glasses, sapphire and quartz may be used, subject to the above processing considerations. The thickness or thinness of the substrate is limited only by its dimensional stability and transparency requirements. Routinely, substrate thicknesses of $\frac{1}{8}$ inch are used.

Disposed above substrate 3 is a substantially continuous conductive electrode layer 2. This layer is present for two purposes. First, the layer sets an electrode for the accelerating voltage; low voltage VFDs do not have an aluminum layer on the cathode side of the phosphor but depend upon a transparent electrode on the face plate. Second, the layer is used in the present method to provide an electrode base upon which phosphor containing charged particles are deposited. Layer 2 must be sufficiently conductive to allow the deposition of charged particles and will thus have a sheet conductivity of from 100-5000 or more ohms per square. Lower sheet conductivities are possible with the limitation that the layer be sufficiently thin to be transparent. Materials which may be used include tin oxide, indium tin oxide and gold. Layer 2 must be continuous in the sense that current will flow through the layer, but it is not required that it completely cover substrate 3. It is necessary that layer 2 be present where deposition of phosphors is desired. The thickness of layer 2 will normally be in the range of 0.5 micron. R.F. sputtering may be used to apply the layer.

Photosensitive resist layer 1 is applied in a substantially continuous fashion over electrode layer 2. Again it is not required that layer 1 completely overlay layer 2, but it is necessary that layer be applied wherever deposition of phosphors is desired, as is further explained below.

The type of photoresist used may be of the positive or negative type, and is selected subject to processing conditions as is well known in the art. The photoresist is applied by known techniques such as spinning, spraying or dipcoating. Electron beam, ion beam or x-ray photoresists may be used, again with due consideration given to the conditions under which the photoresist is processed.

Figure 2:
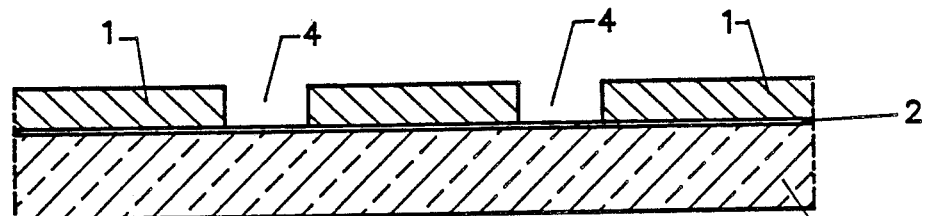
FIG. 2 shows the photoresist layer after development.

The thickness of photoresist layer 1 will vary from about 1 to about 5 microns, with 5 microns preferred, depending on how the resist layer is to be developed. FIG. 2 shows the state of photoresist layer after development. Spaces 4 define the positions in which phosphors are to be deposited. Patterning and development of the photoresist layer to produce spaces 4 is achieved by exposing the photoresist to U.V. light through a photomask. For VFD applications where highly accurate line spacing is needed, the present method has been found satisfactory where the photomask has 0.003 inch wide lines on 0.009 inch spacing. A light of 50 millijoules per square centimeter is satisfactory for development. The exposed photoresist is then developed in a compatible developer and post-baked to provide mechanical strength.

Figure 3:
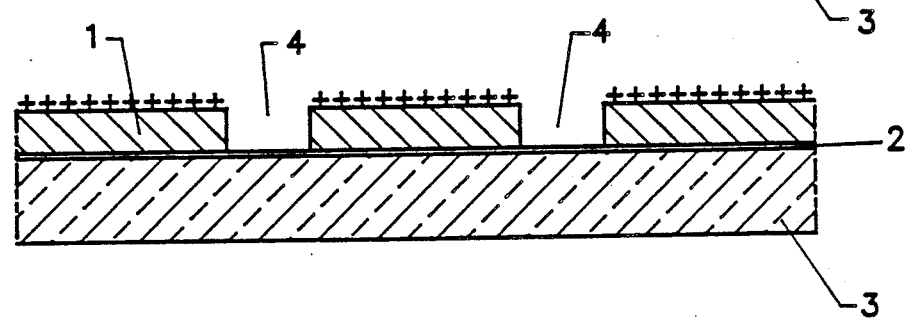
FIG. 3 shows charging of the patterned photoresist layer.

Once the photoresist is developed, deposition of phosphor containing particles can be accomplished, beginning with the step of imparting a surface charge to photoresist layer 1, as is represented in FIG. 3. Charging in this manner is accomplished by corona charging, for example, using a 9000 V corona charger while keeping the transparent conductor at ground.

The reversal toning deposition process of the invention can be accomplished using either a positive or negative corona charge, the charge on the particles to be deposited being of the same sign.

In order to accomplish reversal toning, a toner is prepared which is used to carry the phosphors to the pattern openings in the photoresist. To improve adherence, the desired phosphors may first be mixed with a glass binder and heated together to melt the glass sufficiently to coat the phosphor particles. The resulting particles can then be mixed with a polymeric binder which is useful for temporary binding to the substrate as is discussed further below. While these binders improve adherence, they are not required in all instances. The toner is completed by the addition of a toner carrier liquid. The toner carrier is a nonpolar dispersant liquid which may be a hydrocarbon having a significant vapor pressure, such as a class of high purity kerosenes sold by Exxon Corporation under the name "ISOPAR." Toner carrier liquids of the type useful in the present invention are described in detail in U.S. Pat. No. 4,719,026 to Sher, et al., the contents of which are incorporated herein by reference. As mentioned there, the product referred to as ISOPAR H is particularly preferred as a dispersant.

The glass binder used in the invention will normally be a low melting glass such as glasses which melt below 500° C. Any glass which melts below the softening point of the substrate, is transparent and is chemically compatible with the phosphors to be included can be used. By compatible, it is meant that the glass retains its transparency when processed with the phosphors and in the toner used.

Those skilled in the art will note that many different phosphors are used in CRT and VFD applications. In the present case, phosphors such as P-15(ZnO), P-47 ($Y_2SiO_5$:Ce), P-56 GTE type 1137 ($Y_2O_3$:Eu), P-5 ($CaWO_4$) and GTE type 1642 ($Zn_2SiO_4$:Mn:As) can be used. Sulphur containing phosphors such as ZnS(Cu) or $Y_2O_2S$:Eu are less desirable in the method, however, because the mix blackens, apparently due to reaction of lead in the glass binder to form PbS. These phosphors can be expected to work satisfactorily with lead free glass, however, or where no glass binder is present.

A charge director is also used in the toner, the preferred charge director being barium bistridecyl sulfosuccinate for positive corona charging. Other useful charge directors are noted in U.S. Pat. No. 4,719,026.

Generally the glass binder/phosphor mixture should include each component in about a 50/50 weight ratio, the mixture being incorporated into about 2% by weight concentration of the dispersant. The amount of charge control agent will range from 5 to 20 mg/gram of solids contained in the dispersion.

Figure 4:
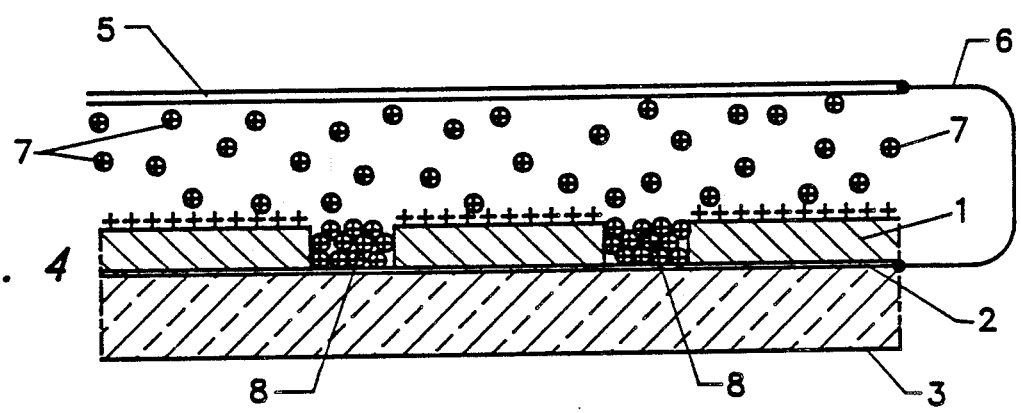
FIG. 4 shows the reversal toning process of depositing the phosphor containing particles.

Once the toner solution is prepared, reversal development may proceed in the manner shown in FIG. 4. In this step glass coated phosphor particles 7 are charged with a charge of the same sign as the charge on the surface of resist layer 1. This reversal toning is an electrostatic reversal printing process of the type which is commonly used in electrophotographic processes as described in "Electrophotography" by R. M. Schaffert, published by John Wiley & Sons (1975) at page 51. It has been found that the use of reversal toning results in charged particles 7 being strongly forced into patterned openings in the photoresist layer, as designated by numeral 8 in FIG. 4. This deposition is accomplished by submersing the charged photoresist in the toner, during which time the photoresist is positioned adjacent counterelectrode 5. Counterelectrode 5 is held at ground potential by using connection 6 to electrode layer 2. Exposure times of from a few seconds to a few minutes are used, depending on the depth of the particle stack 8 desired. The use of an impressed voltage between plate 5 and electrode 2, as is commonly used for electrostatic reversal printing (as discussed by Schaffert) is not required for this method. It has thus been surprisingly found that the adaptation of this reversal toning method provides improved phosphor deposits. It will be apparent, of course, that particles 7 will also deposit on counterelectrode 5, however, this does not affect the quality of the phosphor deposits 8.

Figure 5:
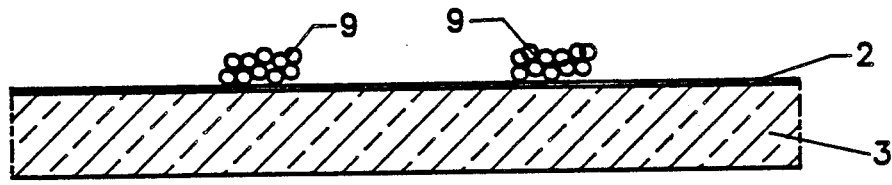
FIG. 5 shows the deposited phosphor containing particles after removal of the photoresist layer.

While not shown in FIG. 4 for clarity, it will be appreciated that some portion of the polymeric binder from the toner, if one is used, will deposit along with the phosphor/glass binder particles. Thus, once particle deposition is completed, the substrate is removed from the toner and heated to drive off the toner carrier liquid and melt the polymeric binder. This allows the phosphor/glass particles to be temporarily fixed to the surface of electrode layer 2, as indicated at 9 in FIG. 5. The substrate is then heated to a temperature and for a time sufficient to burn off the polymeric binder, remove the photoresist layer and melt the glass binder to the degree necessary to permanently bind the phosphor particles.

Figure 6:
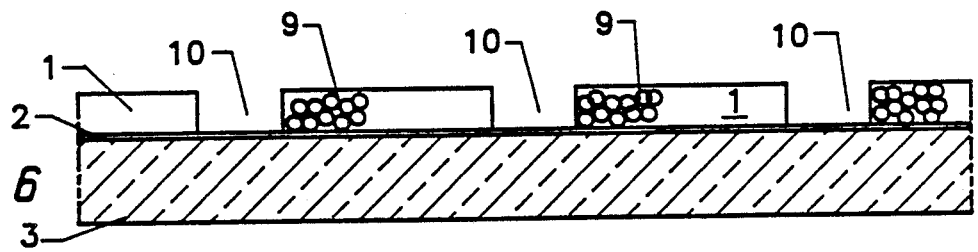
FIG. 6 shows development of a second photoresist layer in preparation for deposition of a second pattern of phosphor containing particles.

In order to deposit second and third phosphors the process is repeated, simply substituting the desired phosphors in to the phosphor/glass binder mixture. FIG. 6 shows one step in the deposition of a second phosphor where new spaces have been developed in photoresist layer 1 adjacent previously deposited stack 9. Once this is accomplished, the surface of the new photoresist is corona charged, a new toner solution is made up including the appropriate phosphor/glass binder particles, the patterned photoresist is subject to reversal toning as described previously. The photoresist layer is then, once again, removed, and the glass binder melted to ensure adherence of the second group of phosphors to the electrode layer. A third phosphor type may then be deposited in the same manner as the second phosphor type.

The use of a polymeric binder such as a polymethylmethacrylate-polybutylmethacrylate binder provides the ability to minimize the number of burn-off steps. That is, in an additional embodiment of the invention, the final heating step is modified for the first and second phosphors. Thus, the deposited phosphor/binder particles are heated only to a temperature and for a time sufficient to melt the polymeric binder. Then the photoresist layer is removed by using a photoresist stripping solution. During the stripping step, the particle stack is temporarily held in place by the polymeric binder. The deposition by reversal toning process is then repeated for deposition of the second phosphors, again using the photoresist stripper. Once the third phosphors are deposited, the substrate is heated for a period of time and at a temperature sufficient to remove the polymeric binder and the photoresist, as well as melt the glass binder.

The following examples provide a further explanation of the invention:

EXAMPLE 1

20 grams of ZnO(Zn) phosphor type P15 and 20 grams of Corning 7570 solder glass are thoroughly mixed in the dry state by tumbling in an 8 oz. polyethylene jar for 1 hour or more. The mixed powders are heated to 600° C. for 10 minutes in a stainless steel dish in a laboratory furnace to melt the solder glass and coat the phosphor particles. The resultant material is ground in a mortar and pestle and sieved through a 150 mesh screen. The powder is mixed with 4 g of a 50-50 copolymer of polymethymethacrylate and N-butylmethacrylate on a rubber mill at 120° until thoroughly blended. The cooled mass is pulverized in a mortar and pestle, then ground with 70 ml Isopar H in a porcelain ball mill for 4 hours. The mixture is removed from the ball mill using 90 ml Isopar H for transfer. The total mixture of 20% solids concentration is the toner concentrate. The toner is prepared by mixing 10 grams of toner concentrate with 90 grams of Isopar H and 0.5 g of Barium Bitridecylsulfosuccinate charge director. This mixture (toner) is tumbled in a polyethylene jar for 2 hours before use.

The substrate is a ⅛' thick plate of Corning 7740 borosilicate glass that has a transparent conductor coating on one surface. The transparent conductor is typically indium tin oxide (ITO) that is applied by r.f. sputtering. Shipley 1650 Microposit photoresist is applied to the ITO surface on a photoresist spinner at 3000 rpm for 20 seconds, post baked for 30 minutes at 90° C., and exposed to a photomask having 0.003 inch wide lines on 0.009 inch spacing. The exposed photoresist is developed with KTI Positive Developer 351 developer and post baked at 120° C. for 30 minutes.

The phosphor is deposited by electrostatic reversal printing in which the resist surface is charged by a 9000 V corona with the transparent conductor at ground potential. The charged plate is "toned" by dipping into a toner bath containing the toner. The bath contains a metal plate or counter electrode that is attached by a wire to the transparent conductor. During toning, the plate is spaced 1-3 mm from the counter electrode by stand-off insulators. The period of toning is 60 seconds after which the plate is removed from the toner bath and excess toner allowed to drain off. The plate is dried and fixed by heating on a laboratory hotplate having a surface temperature starting at 50° C. and increasing to 120° C. over a 15 minute period. The remaining Isopar is driven off and the binder is melted, temporarily fixing the glass phosphor powders in place.

The plate is heat-treated by introduction into a laboratory furnace in an air atmosphere while supported on a flat quartz plate. The plate is introduced directly into the furnace at 650° C. and held for 10 minutes before the furnace is turned off and cooled for 1 hour at about 7° C. per minute. The plate is then at about 250° C. and can be removed to room temperature.

To form a three-color phosphor the above process is repeated two more times with appropriate registration, using red and blue phosphors such as $Y_2O_3$:Eu (P-22) and $CaWO_3$ (P5).

EXAMPLE 2

The plate is processed as in example 1 up to the point where the organic binder is melted fixing the glass/phosphor powders in place. The photoresist is removed with KTI R10 stripper. The phosphor is held in place by the polymeric binder. Red and blue phosphor/glass particles are successively applied with the photoresist pattern, as was the green one. After the third phosphor has been deposited and fixed, the plate is fired a single time as in example 1. It is not necessary to strip the last photoresist before firing to melt the solder glass binder and burn off the residues of the organic binder and photoresist.

What is claimed is:

1. In a method depositing cathodoluminescent materials on a transparent substrate, the steps of:
   (a) applying a transparent electrode layer over a transparent substrate;
   (b) applying a photoresist layer over said transparent electrode layer;
   (c) exposing said photoresist layer to radiation through a photomask;
   (d) developing said photoresist layer to expose areas of said electrode layer in a desired pattern as defined by said photomask;
   (e) charging the surface of said photoresist layer;
   (f) charging phosphor containing particles in a toner with a charge of the same sign as the charge on said photoresist layer;
   (g) depositing said particles in said desired pattern by exposing said photoresist layer to said charged particles in the presence of a counterelectrode.

2. The method of claim 1 wherein said phosphor containing particles further include a glass binder, further including the step of:
   (h) heating said substrate to a temperature and for a period of time sufficient to remove said photoresist and melt said glass binder.

3. The method of claim 1 wherein said transparent substrate is selected from the group consisting of soft glass, borosilicate glass, sapphire and quartz.

4. The method of claim 1, wherein said photoresist layer is charged by corona charging.

5. The method of claim 1, wherein said toner also includes a charge control agent and a dispersant.

6. The method of claim 2, wherein said glass binder comprises glass having a melting point of less than about 500° C.

7. The method of claim 6, wherein said glass binder is a solder glass.

8. The method of claim 3, wherein said substrate is a glass having a melting point above about 500° C.

9. The method of claim 1, wherein said transparent electrode layer comprises a material selected from the group consisting of tin oxide, indium tin oxide and gold.

10. The method of claim 2 further including the steps of:
    (i) applying a second photoresist layer over said transparent electrode and previously deposited particles;
    (j) developing said second photoresist layer to expose areas of said electrode layer adjacent said previously deposited particles;
    (k) charging the surface of said second photoresist layer;
    (l) charging second phosphor and glass binder containing particles in a toner with a charge of the same sign as the charge on the photoresist;
    (m) depositing said particles in said exposed areas by exposing said second photoresist layer to said charged particles in the presence of a counterelectrode; and
    (n) substantially removing said photoresist and heating said substrate to a temperature and for a period of time sufficient to melt said glass binder.

11. The method of claim 10 wherein steps (i) through (n) are repeated to deposit particles containing a third phosphor in areas adjacent said second phosphor containing particles.

12. The method of claim 1 wherein said binder comprises a glass binder and a polymeric binder further including the steps of:
    (h) heating the substrate for a time and at a temperature sufficient to melt said organic binder to temporarily hold said particles in place;
    (i) chemically removing said photoresist layer;
    (j) twice repeating steps (b) through (i) to deposit second and third phosphor containing particles; and
    (k) heating said substrate to a temperature and for a period of time sufficient to remove said photoresist and melt said glass binder.

13. A method of depositing cathodoluminescent materials comprising the steps:
    coating a transparent substrate with a transparent electrode material;
    applying a photoresist layer over at least a portion of said electrode layer;
    patterning said photoresist layer by exposing said photoresist layer to radiation through a photomask;
    developing said photoresist layer to expose an electrode pattern;
    charging said photoresist layer with a charge of a first sign;
    charging a phosphor and glass binder containing particulate mixture with a charge of the same sign as said charge on said photoresist layer;
    depositing particles of said mixture on said electrode pattern by exposing said photoresist layer to said charged particles in the presence of a counterelectrode; and
    heating said deposited materials to a temperature and for a period of time sufficient to melt said glass binder and substantially remove said photoresist layer.

* * * * *